(12) United States Patent
Gao

(10) Patent No.: US 9,898,127 B2
(45) Date of Patent: Feb. 20, 2018

(54) PIXEL STRUCTURE, DISPLAY APPARATUS COMPRISING THE SAME DRIVING METHOD AND MANUFACTURING METHOD FOR THE PIXEL STRUCTURE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Huichao Gao, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 112 days.

(21) Appl. No.: 14/764,117

(22) PCT Filed: Nov. 10, 2014

(86) PCT No.: PCT/CN2014/090692
§ 371 (c)(1),
(2) Date: Jul. 28, 2015

(87) PCT Pub. No.: WO2016/000379
PCT Pub. Date: Jan. 7, 2016

(65) Prior Publication Data
US 2017/0003790 A1    Jan. 5, 2017

(30) Foreign Application Priority Data

Jul. 1, 2014 (CN) .......................... 2014 1 0309546

(51) Int. Cl.
*G06F 3/045* (2006.01)
*G06F 3/041* (2006.01)
(Continued)

(52) U.S. Cl.
CPC .......... *G06F 3/0416* (2013.01); *G02F 1/1368* (2013.01); *G06F 3/042* (2013.01);
(Continued)

(58) Field of Classification Search
CPC .. G06F 3/0412; H01L 27/1251; H01L 27/124
(Continued)

(56) References Cited

U.S. PATENT DOCUMENTS 5,576,857 A * 11/1996 Takemura ........... G02F 1/13624
                                                        345/92
2002/0098635 A1* 7/2002 Zhang ................. H01L 27/1214
                                                        438/199
(Continued)

*Primary Examiner* — Jonathan Blancha
(74) *Attorney, Agent, or Firm* — Harness, Dickey & Pierce, P.L.C.

(57) ABSTRACT

A pixel structure includes a pixel electrode and a pixel switch including a gate electrode, an upper source electrode, an upper drain electrode, an upper active layer, a lower source electrode, a lower drain electrode, and a lower active layer. A bottom-gate TFT is formed by the upper source electrode, the upper active layer, the upper drain electrode and the gate electrode; a top-gate TFT is formed by the lower source electrode, the lower active layer, the lower drain electrode and the gate electrode. The upper source electrode is connected to the lower source electrode. The pixel electrode includes a first sub-pixel electrode and a second sub-pixel electrode. The first sub-pixel electrode is connected to the upper drain electrode for receiving a first signal; the second sub-pixel electrode is connected to the lower drain electrode for receiving a second signal from the bottom-gate TFT different from the first signal.

12 Claims, 6 Drawing Sheets

(51) Int. Cl.
*G02F 1/1368* (2006.01)
*G06F 3/044* (2006.01)
*G09G 3/20* (2006.01)
*H01L 27/12* (2006.01)
*G06F 3/042* (2006.01)
*G02B 27/22* (2018.01)

(52) U.S. Cl.
CPC ............ G06F 3/044 (2013.01); G06F 3/0412 (2013.01); G09G 3/2096 (2013.01); H01L 27/124 (2013.01); H01L 27/1251 (2013.01); H01L 27/1255 (2013.01); *G02B 27/22* (2013.01); *G06F 2203/04103* (2013.01); *G06F 2203/04107* (2013.01); *G09G 2300/0426* (2013.01); *G09G 2300/0809* (2013.01)

(58) Field of Classification Search
USPC ......................................................... 345/174
See application file for complete search history.

(56) References Cited

U.S. PATENT DOCUMENTS

| | | | | |
|---|---|---|---|---|
| 2010/0059296 A9* | 3/2010 | Abileah | .............. | G02F 1/13338 178/18.09 |
| 2010/0231495 A1* | 9/2010 | Kang | .................... | G02F 1/1354 345/92 |
| 2014/0252326 A1* | 9/2014 | Koo | .................... | H01L 27/3262 257/40 |

\* cited by examiner

US 9,898,127 B2

PIXEL STRUCTURE, DISPLAY APPARATUS COMPRISING THE SAME DRIVING METHOD AND MANUFACTURING METHOD FOR THE PIXEL STRUCTURE

CROSS-REFERENCE TO RELATED APPLICATION

The present application is the U.S. national phase of PCT Application No. PCT/CN2014/090692 filed on Nov. 10, 2014, which claims the priority of Chinese patent application No. 201410309546.5 filed on Jul. 1, 2014, the disclosure of which is incorporated herein by reference.

TECHNICAL FIELD

The present disclosure relates to the display field, in particular to a pixel structure, a display apparatus, and a driving method and a manufacturing method for the pixel structure.

BACKGROUND

As the touch screen technology is gradually mature, a thin film transistor (TFT) with a touch function is increasingly favored by consumers. However, for the existing TFTs with touch functions, the production process is complex, production costs are relatively high and a display thereof is a 2-dimensional (2D) display. As the 3-dimensional (3D) display is popular all over the world, people are looking forward to a touch screen with 3D display effect.

Therefore, how to combine a 3D display with a touch technology has become an urgent technical problem needed to be solved.

SUMMARY

In order to solve the problem that in the existing display apparatus the 3D display technology and the touch technology cannot be integrated, the present disclosure provides a pixel structure, a display apparatus and a driving method and a manufacturing method for the pixel structure.

In an aspect, the present disclosure provides a pixel structure, including: a pixel switch including a gate electrode, an upper source electrode, an upper drain electrode, an upper active layer, a lower source electrode, a lower drain electrode and a lower active layer; the upper source electrode, the upper active layer, the upper drain electrode and the gate electrode forming a bottom-gate thin film transistor (TFT), the lower source electrode, the lower active layer, the lower drain electrode and the gate electrode forming a top-gate TFT; the upper source electrode and the lower source electrode being connected to each other; a touch unit, configured to obtain a touch position signal, an output end of which is connected to the upper source electrode and the lower source electrode, respectively, and configured to transmit the touch position signal to the bottom-gate TFT and the top-gate TFT, respectively; and a pixel electrode, including a first sub-pixel electrode and a second sub-pixel electrode, the first sub-pixel electrode being connected to the upper drain electrode and configured to receive a first signal transmitted from the top-gate TFT; and the second sub-pixel electrode is connected to the lower drain electrode and configured to receive a second signal transmitted from the bottom-gate TFT which is different from the first signal.

In another aspect, the present disclosure provides a display apparatus, including the above pixel structure.

In yet another aspect, the present disclosure provides a method for driving a pixel structure, including:
obtaining a touch position signal;
transmitting the touch position signal to a pixel switch having a top-gate thin film transistor (TFT) and a bottom-gate TFT, wherein the pixel switch includes a gate electrode, an upper source electrode, an upper drain electrode, an upper active layer, a lower source electrode, a lower drain electrode and a lower active layer; the bottom-gate TFT is formed by the upper source electrode, the upper active layer, the upper drain electrode and the gate electrode; the top-gate TFT is formed by the lower source electrode, the lower active layer, the lower drain electrode and the gate electrode; and the upper source electrode and lower source electrode are connected to each other;
transmitting a first signal outputted by the top-gate TFT to a first sub-pixel electrode of the pixel electrode and transmitting a second signal outputted by the bottom-gate TFT to a second sub-pixel electrode of the pixel electrode at a speed different from that at which the first signal is transmitted.

In still another aspect, the present disclosure provides a method for manufacturing a pixel structure, including:
forming a substrate;
forming a sensing thin film transistor (TFT), a switching TFT and a bottom-gate TFT of a photosensitive switch on the substrate; wherein the sensing TFT includes a first active layer, a first source electrode, a first drain electrode and a first gate electrode; the switching TFT includes a second active layer, a second source electrode, a second drain electrode and a second gate electrode; and the upper source electrode and the lower source electrode are connected to each other;
forming a top-gate TFT which shares a common gate electrode with the bottom-gate TFT; wherein the source electrode of the top-gate TFT and the source electrode of the bottom-gate TFT are both connected to the drain electrode of the switching TFT.

The beneficial effect of the present disclosure is as follows. In the above pixel structure, the touch signal is converted into the electrical signal and the generated electrical signal is transmitted to different sub-pixel electrodes. Since the pixel switch is designed with a top-gate TFT and a bottom-gate TFT, the transmission of the signal to the sub-pixel electrodes is not synchronized. Therefore, the final display is stereoscopic and a 3D display effect is achieved. In the present disclosure, the touch technology and 3D display technology are integrated as a whole, the production process is relatively simple and a resolution of the display is improved.

In the figures:
1: substrate, 2: first gate electrode, 3: first electrode of capacitor, 4: first insulation layer, 5: lower source electrode, 6: first active layer, 7: first source electrode, 8: second drain electrode, 9: second insulation layer, 10: third gate electrode, 11: gate insulating layer, 12: upper active layer, 13: upper source electrode, 14: upper insulation layer, 15: first light shielding layer, 16: peripheral passivation layer, 17: second gate electrode, 18: lower drain electrode, 19: second active layer, 20: lower active layer, 21: first drain electrode, 22: second source electrode, 23: upper drain electrode, 24: second light shielding layer.

DETAILED DESCRIPTION

In order to make the technical problems to be solved, technical solutions and advantages of the embodiments of the present disclosure more clear, description will be given hereinafter in conjunction with the accompanying drawings and embodiments of the present disclosure.

Figure 16:
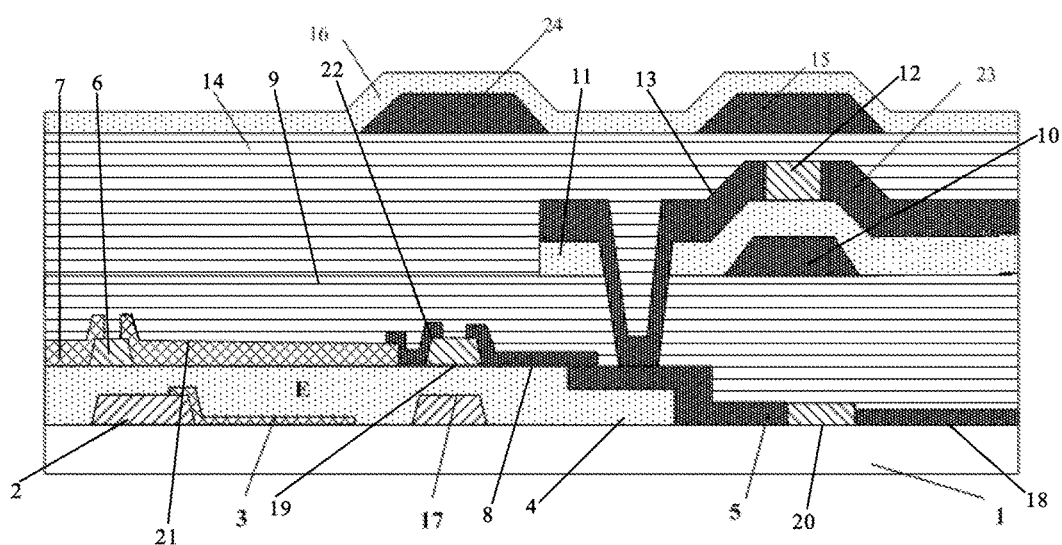
FIG. 16 is a schematic diagram showing forming a peripheral passivation layer in a pixel structure according to one embodiment of the present disclosure.

FIG. 16 is a schematic diagram of a pixel structure according to one embodiment of the present disclosure. The pixel structure includes:

a pixel switch, including a third gate electrode 10, an upper source electrode 13, an upper drain electrode 23, an upper active layer 12, a lower source electrode 5, a lower drain electrode 18 and a lower active layer 20; the upper source electrode 13, the upper active layer 12, the upper drain electrode 23 and the third gate electrode 10 forming a bottom-gate TFT; the lower source electrode 5, the lower active layer 20, the lower drain electrode 18 and the third gate electrode 10 forming, a top-gate TFT; the upper source electrode 13 being connected with the lower source electrode 5;

a touch unit, configured to obtain a touch position signal, an output end of which is connected to the upper source electrode 13 and the lower source electrode 5, respectively, and configured to convert the touch position signal into an electrical signal and transmit it to the bottom-gate TFT and the top-gate TFT, respectively; and a pixel electrode including a first sub-pixel electrode and a second sub-pixel electrode; the first sub-pixel electrode being connected to the upper drain electrode 23 and configured to receive a first signal transmitted from the top-gate TFT; and the second sub-pixel electrode being connected to the lower drain electrode 18 and configured to receive a second signal transmitted from the bottom-gate TFT which is different from the first signal.

In the pixel structure according to the present disclosure, the touch signal is convened into the electrical signal and the generated electrical signal is transmitted to different sub-pixel electrodes. Since the pixel switch is designed with a top-gate TFT and a bottom-gate TFT, the transmission of the signal to the sub-pixel electrodes is not synchronized. Therefore, the final display is stereoscopic and a 3D display effect is achieved. In the present disclosure, the touch technology and 3D display technology are integrated as a whole, and the production process is relatively simple.

The touch unit in the present disclosure is configured to obtain the touch position signal and may be a capacitive, resistive, or photosensitive touch unit, so as to obtain the touch position.

When the touch unit is a capacitive touch unit, the touch position can be obtained by using a change of a capacitance generated between a finger and a touch electrode. The output end of the touch unit is connected to the upper source electrode 13 and the lower source electrode 5, respectively, and configured to transmit the touch position signal to the bottom-gate TFT and the top-gate TFT.

When the touch unit is a resistive touch unit, the touch position can be obtained by using a change of a resistance connected between two substrates. The output end of the touch unit is connected to the upper source electrode 13 and the lower source electrode 5, respectively, and configured to transmit the touch position signal to the bottom-gate TFT and the top-gate TFT.

When the touch unit is a photosensitive touch unit, the touch position can be obtained by using a change of light between two substrates. An output end of a photosensitive diode is connected to the upper source electrode 13 and the lower source electrode 5 through a capacitor, respectively, and configured to transmit the touch position signal to the bottom-gate TFT and the top-gate TFT.

Referring to FIG. 16 again, a gate insulating layer 11 is formed between the third gate electrode 10 and the upper active layer 12. The upper source electrode 13 of the top-gate TFT is connected to the lower source electrode 5 through the via hole. The upper drain electrode 23 and the lower drain electrode 18 are each connected to one of the sub-pixel electrodes in the pixel electrode. In one embodiment, the touch unit is of a photosensitive touch structure, which includes a sensing TFT and a switching TFT. The sensing TFT includes a first active layer 6, a first source electrode 7, a first drain electrode 21 and a first gate electrode 2. A first electrode 3 of a capacitor is formed on the first gate electrode 2. A capacitor structure is formed by the first electrode 3 of the capacitor and the first drain electrode 21. The switching TFT includes a second active layer 19, a second source electrode 22, a second drain electrode 8 and a second gate electrode 17. The first drain electrode 21 and the second source electrode 22 are connected to each other. The second drain electrode 8 is connected to the upper source electrode 13 of the top-gate TFT and the lower source electrode 5 of the bottom-gate TFT, respectively.

A first insulation layer 4 is formed between the first gate electrode 2 and the first active layer 6 and between the second gate electrode 17 and the second active layer 19. A second insulation layer 9 is further formed on the photosensitive touch structure. The sensing TFT in the photosensitive touch structure is able to obtain a light sensing signal, and then store the sensing signal into the capacitor. The photosensitive switch can generate an electrical signal when the received light changes, and transmit the electrical signal through the capacitor to the switching TFT. In the present disclosure, a first light shielding layer 15 is provided at a position corresponding to the active layer of the top-gate TFT and a second light shielding layer 24 is provided at a position corresponding to the active layer of the switching TFT, both of which are configured to shield the light.

In the present disclosure, the photosensitive touch structure includes the sensing TFT and the switching TFT, and the sensing TFT is integrated near the switching TFT (as shown in FIG. 16). The sensing TFT is not covered with a shielding plate. When the panel is touched, a photocurrent generated by the sensing TFT is changed when external brightness changes, and the generated photocurrent is collected by the capacitor, so that a touch event is confirmed and a touch position is determined. Then the photocurrent collected by the capacitor is transmitted to the switching TFT, at this time a certain influence on the capacitor is generated by the current. When a certain voltage is applied to the gate electrode of the switching TFT, the switching TFT is turned on and then the current stored in the capacitor is conducted to the pixel switch which has the top-gate TFT and the bottom-gate TFT. Since transmission speeds of the current in the top-gate TFT and the bottom-gate TFT are different, thus different display signals have different delays, which make the display have a stereo display, thereby achieving the 3D display effect. If the signals have no delay, the 2D display effect can be improved, thereby improving the quality of the display. Further, in the present disclosure, structures of the bottom-gate TFT and the top-gate TFT can be designed to achieve a free switching between the 2D display and the 3D display.

In the present disclosure, the pixel switch has two TFTs, including the bottom-gate TFT and the top-gate TFT which share one common gate electrode. The transmission speeds of an identical signal in two TFTs are different. Specifically, the upper active layer of the top-gate TFT and the lower active layer of the bottom-gate TFT can be designed with different thicknesses or of different materials so as to make transmission time of an identical signal in the top-gate TFT and the bottom-gate TFT be different. Specifically, in one embodiment, the thicknesses of the active layers of the top-gate TFT and the bottom-gate TFT are different so as to make speeds of the current passing through the top-gate TFT and the bottom-gate TFT different. As a result, a charging time of each sub-pixel electrode is different, so that the display is of a stereo display and the 3D display effect can be achieved.

Specifically, the 3D display is achieved in a shutter glasses manner. That is, at a first moment, a left eye view is sent to a left eye and a black view is sent to a right eye; and at a second moment, a right eye view is sent to the right eye and a black view is sent to the left eye. By controlling the speeds of the current in the bottom-gate TFT and the top-gate TFT, the left eye view is displayed by receiving the first signal by the first sub-pixel electrode and the right eye view is displayed by receiving the second signal which is different from the first signal by the second sub-pixel electrode, so as to achieve the 3D display effect.

In the embodiment, the pixel electrode includes two sub-pixel electrodes, one of which is connected to the upper drain electrode of the top-gate TFT and the other of which is connected to the lower drain electrode of the bottom-gate TFT. The two sub-pixel electrodes may be adjacent or arranged at intervals. Finally, a grille effect is formed.

The present disclosure further provides in one embodiment a display apparatus, including the above-described pixel structure. The display apparatus may be an organic light-emitting diode (OLED) display apparatus or a liquid crystal display apparatus.

The present disclosure further provides in one embodiment a method for driving a pixel structure, including the following steps:

Step 1: obtaining a touch position signal;

Step 2: transmitting the touch position signal to a pixel switch having a top-gate TFT and a bottom-gate TFT; the pixel switch including a gate electrode, an upper source electrode, an upper drain electrode, an upper active layer, a lower source electrode, a lower drain electrode and a lower active layer; the upper source electrode, the upper active layer, the upper drain electrode and the gate electrode forming a bottom-gate TFT; the lower source electrode, the lower active layer, the lower drain electrode and the gate electrode forming a top-gate TFT; the upper source electrode and lower source electrode being connected to each other;

Step 3: transmitting a first signal outputted by the top-gate TFT to a first sub-pixel electrode of the pixel electrode and transmitting a second signal outputted by the bottom-gate TFT to a second sub-pixel electrode of the pixel electrode at a speed different from that at which the first signal is transmitted.

In step 1, the step of obtaining a touch position signal may adopt a capacitive, resistive or photosensitive touch structure so as to obtain the touch position.

In step 2, specific structures of the pixel switch, the top-gate TFT and the bottom-gate TFT may refer the above description.

In step 3, the first signal outputted by the top-gate TFT is transmitted to the first sub-pixel electrode of the pixel electrode and the second signal outputted by the bottom-gate TFT is transmitted to the second sub-pixel electrode of the pixel electrode at a speed different from that at which the first signal is transmitted. Since the signals outputted by the top-gate TFT and the bottom-gate TFT are transmitted to the pixel electrode at different speeds, the charging time of each sub-pixel electrode is different, so that the display is of a stereo display and the 3D display effect is achieved.

The present disclosure further provides in one embodiment a method for manufacturing a pixel structure, which will be described below in detail with specific embodiments.

Figure 1:
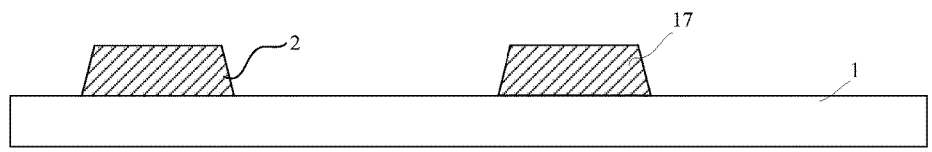
FIG. 1 is a schematic diagram showing forming a gate electrode of a photosensitive switch in a pixel structure according to one embodiment of the present disclosure.

FIG. 1 is a schematic diagram showing forming a gate electrode of a photosensitive switch in a pixel structure according to one embodiment of the present disclosure. In this step, a first gate electrode 2 and a second gate electrode 17 are formed on a substrate 1 at intervals. The substrate 1 may be made of glass or plastic. The first gate electrode 2 and the second gate electrode 17 may be formed by the following steps: sputtering a film by using a sputter, depositing a layer of AL/Mo or Cr or AlNd/Mo; coating, exposing and developing a photoresist to complete a pattern transference; wet etching and then stripping. A gate electrode pattern as shown in FIG. 1 is obtained.

Figure 2:
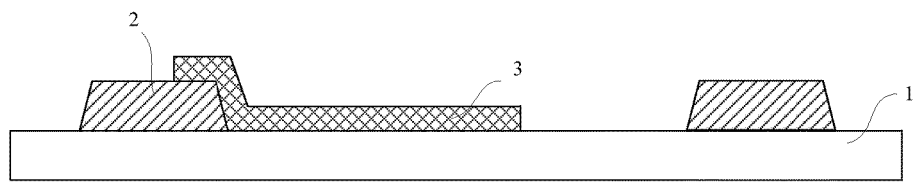
FIG. 2 is a schematic diagram showing forming a capacitor electrode in a pixel structure according to one embodiment of the present disclosure.

FIG. 2 is a schematic diagram showing forming a capacitor electrode in a pixel structure according to one embodiment of the present disclosure. In this step, a capacitor electrode 3 is formed on the substrate 1 and the first gate electrode 2. One end of the capacitor electrode is lapped on the substrate and the other end is lapped on the first gate electrode 2. The capacitor electrode 3 may be formed by the following steps: sputtering a film by using a sputter, depositing a layer of ITO or coating a layer of carbon nanotubes or a graphene film by coating technology; coating, exposing and developing a photoresist to complete a pattern transference; wet etching and then stripping. A pattern as shown in FIG. 2 is obtained.

Figure 3:
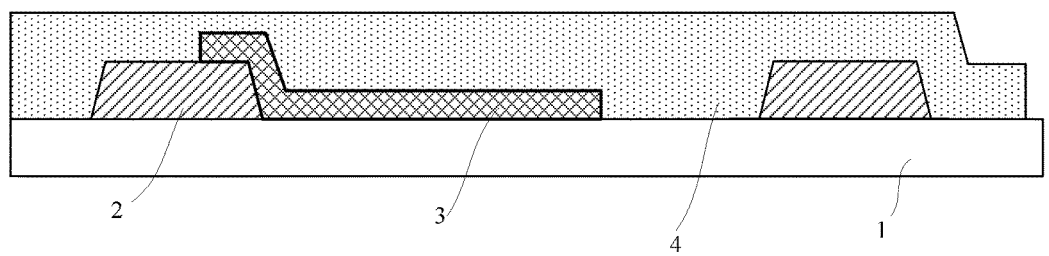
FIG. 3 is a schematic diagram showing forming an insulation layer of a photosensitive switch in a pixel structure according to one embodiment of the present disclosure.

FIG. 3 is a schematic diagram showing forming an insulation layer of a photosensitive switch in a pixel structure according to one embodiment of the present disclosure. A first insulation layer 4 is coated on the first gate electrode 2 and the second gate electrode 17. The first insulation layer 4 further covers the capacitor electrode 3. The first insulation layer 4 may be formed by the following steps: depositing a layer of SiNX by a PECVD technology, or coating a layer of resin by coating technology, as a gate electrode insulation layer; exposing, developing and then etching. A pattern as shown in FIG. 3 is obtained.

Figure 4:
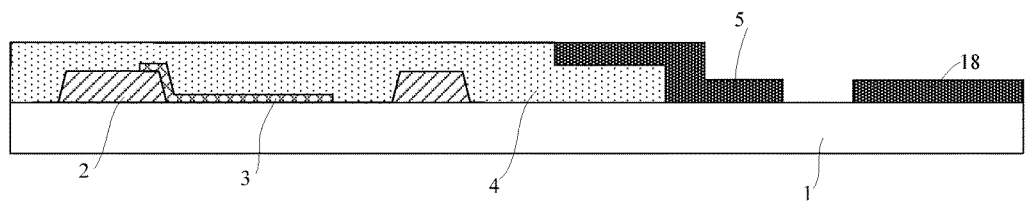
FIG. 4 is a schematic diagram showing forming source and drain electrodes of a bottom-gate TFT structure in a pixel structure according to one embodiment of the present disclosure.

FIG. 4 is a schematic diagram showing forming source and drain electrodes of a bottom-gate TFT structure in a pixel structure according to one embodiment of the present disclosure. The lower source electrode 5 and the lower drain electrode 18 of the bottom-gate TFT are formed on the substrate 1. The lower source electrode 5 of the bottom-gate TFT is lapped on the first insulation layer 4. The lower source electrode and the lower drain electrode of the bottom-gate TFT may be formed by the following steps: sputtering a film by using a sputter, depositing a layer of Mo or Cr or AlNd/Mo; coating, exposing and developing a photoresist to complete a pattern transference; wet etching and then stripping. A pattern as shown in FIG. 4 is obtained.

Figure 5:
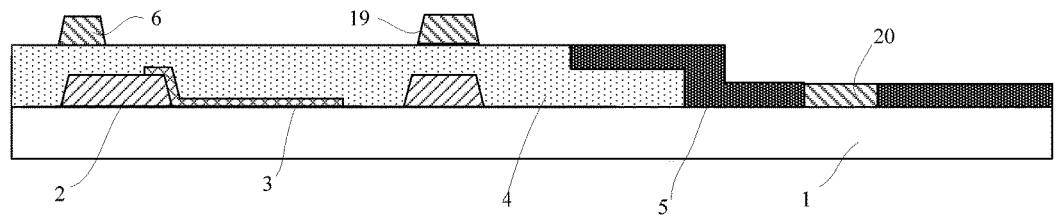
FIG. 5 is a schematic diagram showing forming an active layer of a bottom-gate TFT structure and an active layer of a photosensitive switch in a pixel structure according to one embodiment of the present disclosure.

FIG. 5 is a schematic diagram showing forming an active layer of a bottom-gate TFT structure and an active layer of a photosensitive switch in a pixel structure according to one embodiment of the present disclosure. In this step, a first active layer 6 and a second active layer 19 are formed at positions corresponding to the first gate electrode 2 and the second gate electrode 17, respectively. A lower active layer 20 is formed between the lower source and drain electrodes of the bottom-gate TFT. The active layers may be formed by the following steps: depositing a layer of aSi or IGZO by a PECVD technology, exposing, developing and then etching. A pattern as shown in FIG. 5 is obtained.

Figure 6:
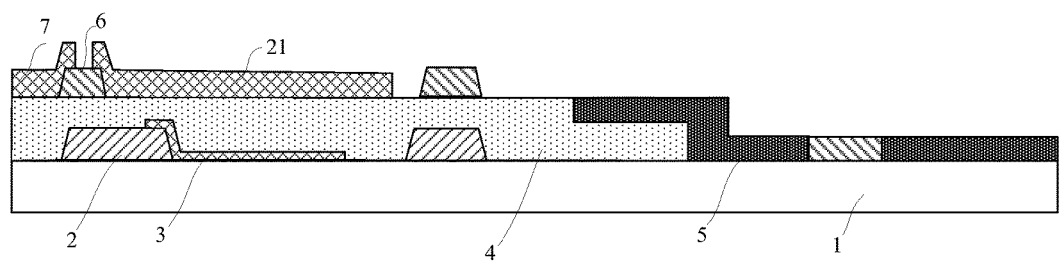
FIG. 6 is a schematic diagram showing forming source and drain electrodes of a sensing TFT of a photosensitive switch in a pixel structure according to one embodiment of the present disclosure.

FIG. 6 is a schematic diagram showing forming source and drain electrodes of a sensing TFT of a photosensitive switch in a pixel structure according to one embodiment of the present disclosure. A first source electrode 7 and a first drain electrode 21 which are connected to the first active layer are formed at a position corresponding to the first active layer 6. The source and drain electrodes of the sensing TFT of the photosensitive switch may be formed by the following steps: sputtering a film by using a sputter; depositing a layer of ITO or coating a layer of carbon nanotubes or a graphene film by coating technology; coating, exposing and developing a photoresist to complete a pattern transference; wet etching and then stripping. A pattern as shown in FIG. 6 is obtained.

Figure 7:
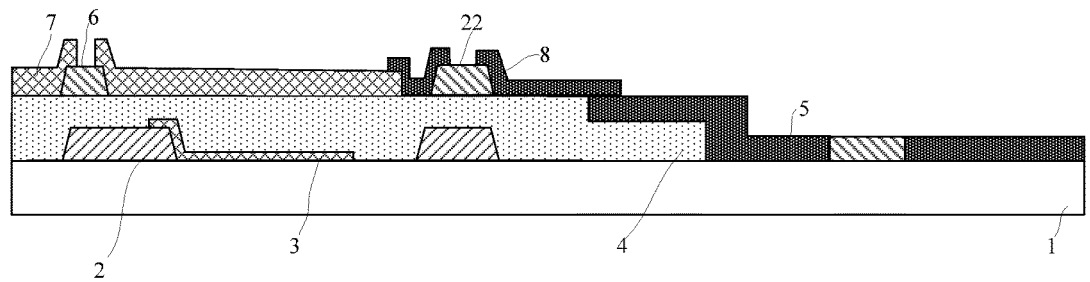
FIG. 7 is a schematic diagram showing forming source and drain electrodes of a switching TFT of a photosensitive switch in a pixel structure according to one embodiment of the present disclosure.

FIG. 7 is a schematic diagram showing forming source and drain electrodes of a switching TFT of a photosensitive switch in a pixel structure according to one embodiment of the present disclosure. A second source electrode 22 and a second drain electrode 8 which are connected to the second active layer is formed at a position corresponding to the second active layer 19. The source and drain electrodes of the switching TFT may be formed by the following steps: sputtering a film by using a sputter; depositing a layer of Mo or Cr or AlNd/Mo; coating, exposing and developing a photoresist to complete a pattern transference; wet etching and then stripping. A pattern as shown in FIG. 7 is obtained.

Figure 8:
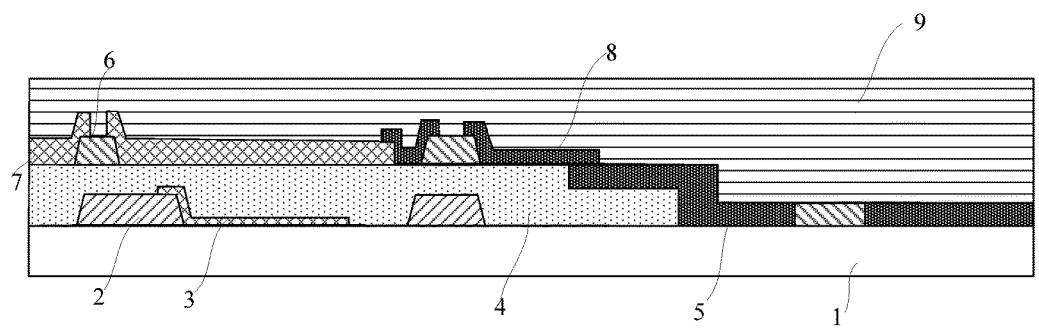
FIG. 8 is a schematic diagram showing forming an insulation layer of a photosensitive switch in a pixel structure according to one embodiment of the present disclosure.

FIG. 8 is a schematic diagram showing forming an insulation layer of a photosensitive switch in a pixel structure according to one embodiment of the present disclosure. A second insulation layer 9 is formed on the source and drain electrodes of the photosensitive switch and the bottom-gate TFT. The second insulation layer 9 may be formed by depositing a layer of SiNX by a PECVD technology, or coating a layer of resin by coating technology.

Figure 9:
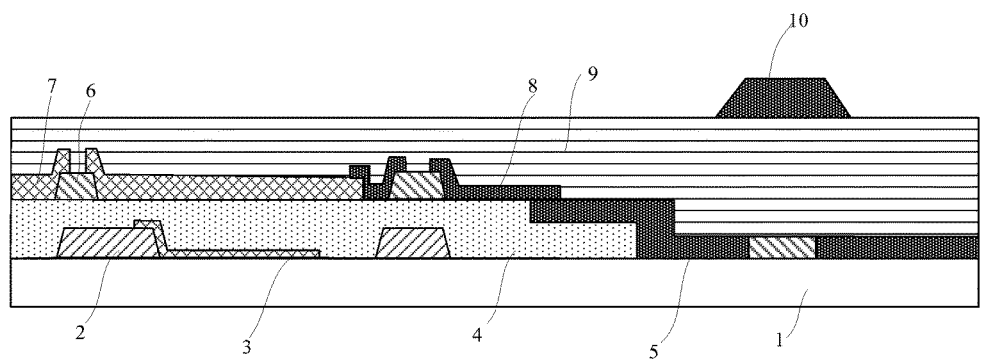
FIG. 9 is a schematic diagram showing forming a gate electrode in a pixel structure according to one embodiment of the present disclosure.

FIG. 9 is a schematic diagram showing forming a gate electrode in a pixel structure according to one embodiment of the present disclosure. The third gate electrode 10 is formed on the second insulation layer 9 and corresponds to the source and drain electrodes of the bottom-gate TFT. It may be formed by the following steps: sputtering a film by using a sputter; depositing a layer of Mo or Cr or AlNd/Mo; coating, exposing and developing a photoresist to complete a pattern transference; wet etching and then stripping. A pattern as shown in FIG. 9 is obtained.

Figure 10:
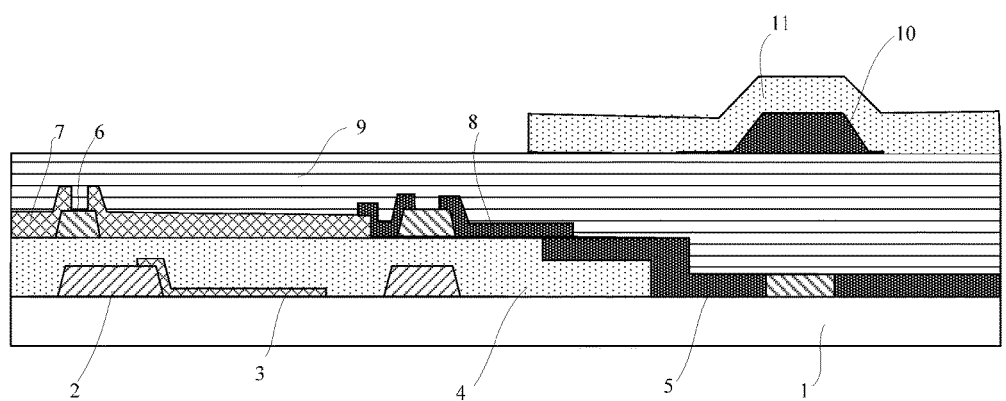
FIG. 10 is a schematic diagram showing forming a gate insulating layer in a pixel structure according to one embodiment of the present disclosure.

FIG. 10 is a schematic diagram showing forming a gate insulating layer in a pixel structure according to one embodiment of the present disclosure. A gate insulating layer 11 is formed on the third gate electrode 10 and covers the gate electrode. The gate insulating layer may be formed by the following steps: depositing a layer of SiNX by a PECVD technology, or coating a layer of resin by coating technology, as a gate electrode insulation layer; exposing, developing and then etching. A pattern as shown in FIG. 10 is obtained.

Figure 11:
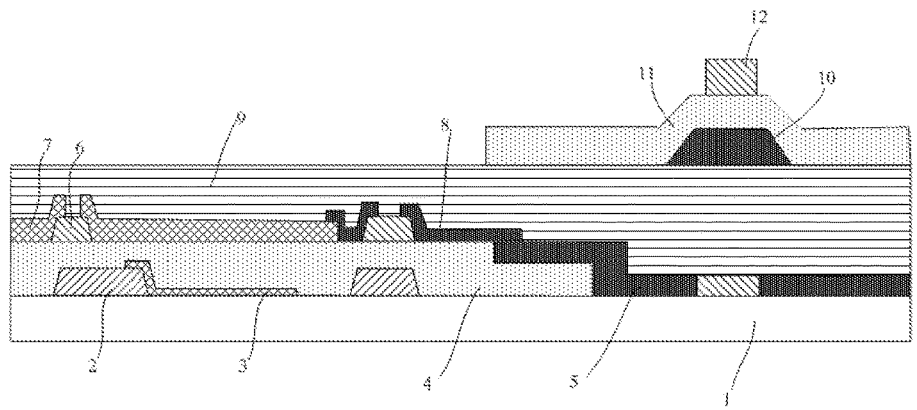
FIG. 11 is a schematic diagram showing forming an active layer of a top-gate TFT in a pixel structure according to one embodiment of the present disclosure.

FIG. 11 is a schematic diagram showing forming an active layer of a top-gate TFT in a pixel structure according to one embodiment of the present disclosure. An upper active layer 12 is formed on the gate insulating layer 11 and corresponds to the gate electrode. The upper active layer 12 may be formed by the following steps: depositing a layer of aSi or IGZO by a PECVD technology, exposing, developing and then etching. A pattern as shown in FIG. 11 is obtained.

Figure 12:
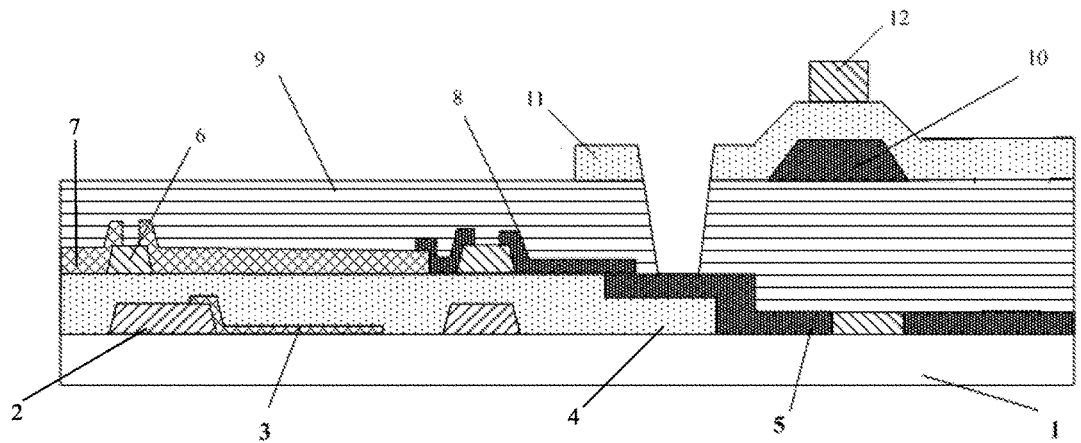
FIG. 12 is a schematic diagram showing forming a via hole in a pixel structure according to one embodiment of the present disclosure.

FIG. 12 is a schematic diagram showing forming via holes in a pixel structure according to one embodiment of the present disclosure. Via holes are formed on two sides of the active layer of the top-gate TFT to connect the drain electrode of the bottom-gate TFT. The via holes may be formed by the following steps: coating, exposing and developing a photoresist; etching and then stripping. After the above processes, a pattern as shown in FIG. 12 is obtained.

Figure 13:
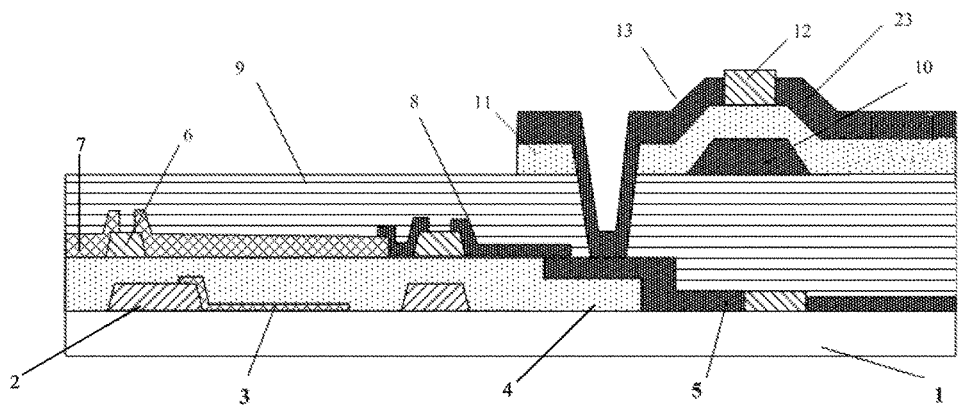
FIG. 13 is a schematic diagram showing forming source and drain electrodes of a top-gate TFT in a pixel structure according to one embodiment of the present disclosure.

FIG. 13 is a schematic diagram showing forming source and drain electrodes of a top-gate TFT in a pixel structure according to one embodiment of the present disclosure. An upper source electrode 13 and an upper drain electrode 23 connected to the upper active layer 12 are formed on the upper active layer 12. The source and drain electrodes of the top-gate TFT may be formed by the following steps: sputtering a film by using a sputter; depositing a layer of Mo or Cr or AlNd/Mo; coating, exposing and developing a photoresist to complete a pattern transference; wet etching and then stripping. After the above processes, a pattern as shown in FIG. 13 is obtained.

Figure 14:
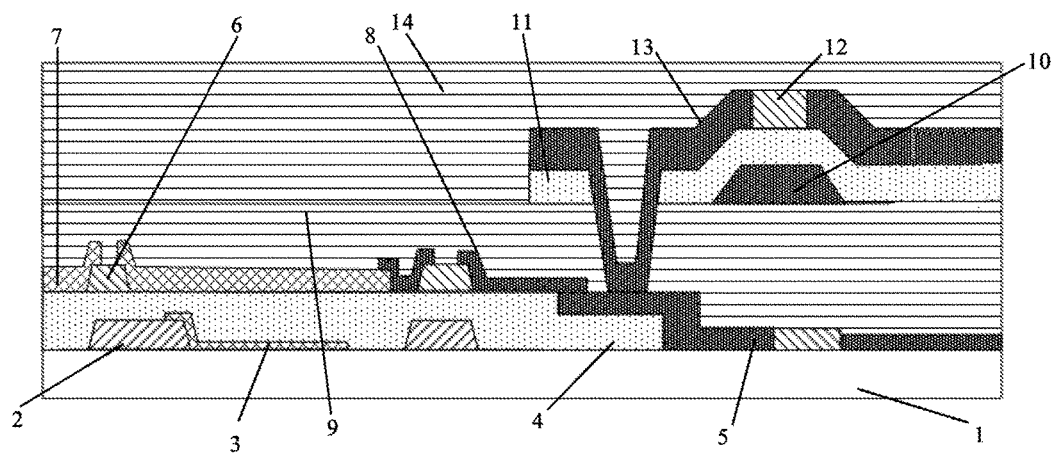
FIG. 14 is a schematic diagram showing forming an upper insulation layer of a top-gate TFT in a pixel structure according to one embodiment of the present disclosure.

FIG. 14 is a schematic diagram showing forming an upper insulation layer of a top-gate TFT in a pixel structure according to an embodiment of the present disclosure. An upper insulation layer 14 is formed on the source and drain electrodes of the top-gate TFT. The upper insulation layer 14 covers the photosensitive switch. The upper insulation layer may be formed by the following steps: coating a layer of resin by coating technology, or depositing a layer of SiNX or other insulation materials by a PECVD technology. Then, a pattern as shown in FIG. 14 is obtained.

Figure 15:
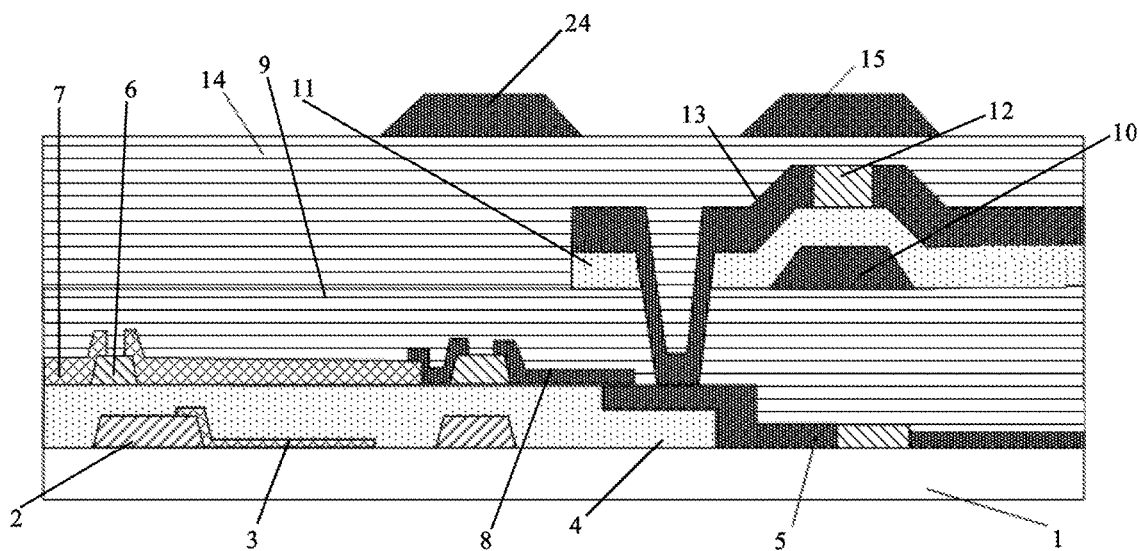
FIG. 15 is a schematic diagram showing forming a light shielding layer in a pixel structure according to one embodiment of the present disclosure.

FIG. 15 is a schematic diagram showing forming a light shielding layer in a pixel structure according to one embodiment of the present disclosure. A first light shielding layer 15 is formed on the upper active layer 12 and a second light shielding layer 24 is formed on the second active layer 19. The light shielding layers may be formed by the following steps: sputtering a film by using a sputter; depositing a layer of Mo or Cr or AlNd/Mo; coating, exposing and developing a photoresist to complete a pattern transference; wet etching and then stripping. After the above processes, a pattern as shown in FIG. 15 is obtained.

FIG. 16 is a schematic diagram showing forming a peripheral passivation layer in a pixel structure according to one embodiment of the present disclosure. A peripheral passivation layer 16 is formed on the periphery of the light shielding layers and the second insulation layer 9. The peripheral passivation layer may be formed by depositing a layer of SiNX or other transparent insulation materials by a PECVD technology to function as a protection layer of the light shielding layers.

In the above pixel structure, the touch signal is converted into the electrical signal and the generated electrical signal is transmitted to different sub-pixel electrodes. Since the pixel switch is designed with a top-gate TFT and a bottom-gate TFT, the transmission of the signal to the sub-pixel electrodes is not synchronized. Therefore, the final display is stereoscopic and a 3D display effect is achieved. In the present disclosure, the touch technology and 3D display technology are integrated as a whole, the production process is relatively simple and a resolution of the display is improved.

The above is only preferred embodiments of the present disclosure, it should be noted that several improvements and modifications may be made for those of ordinary skill in the art without departing from the principle of the present disclosure, and also should be considered to fall within the protection scope of the present disclosure.

What is claimed is:

1. A pixel structure comprising:
a pixel switch, comprising a gate electrode, an upper source electrode, an upper drain electrode, an upper active layer, a lower source electrode, a lower drain electrode, and a lower active layer; wherein the upper source electrode, the upper active layer, the upper drain electrode, and the gate electrode form a bottom-gate thin film transistor (TFT); the lower source electrode, the lower active layer, the lower drain electrode and the gate electrode form a top-gate TFT; the upper source electrode and the lower source electrode are connected to each other;
a touch unit, configured to obtain a touch position signal; wherein an output end of the touch unit is connected to the upper source electrode and the lower source electrode, respectively, and configured to transmit the touch position signal to the bottom-gate TFT and the top-gate TFT, respectively, the touch unit including a photosensitive touch structure comprising a sensing TFT and a switching TFT; the sensing TFT comprising a first active layer, a first source electrode, a first drain electrode, and a first gate electrode; the switching TFT comprising a second active layer, a second source electrode, a second drain electrode, and a second gate electrode;
a pixel electrode comprising a first sub-pixel electrode and a second sub-pixel electrode; wherein the first sub-pixel electrode is connected to the upper drain electrode and configured to receive a first signal transmitted from the top-gate TFT; and the second sub-pixel electrode connected to the lower drain electrode and configured to receive a second signal transmitted from the bottom-gate TFT, the second signal different from the first signal, and
a capacitor formed by a first electrode and the first drain electrode,
wherein the first electrode of the capacitor, the first gate electrode, the second gate electrode, the lower source electrode, the lower drain electrode, and the lower active layer are arranged at an identical layer and on a substrate, the first electrode of the capacitor is in contact with and electrically connected to the first gate electrode;
a first insulation layer arranged on and covering the first electrode of the capacitor, the first gate electrode, the second gate electrode, and the substrate;
the first source electrode, the first drain electrode, the first active layer, the second source electrode, the second drain electrode, and the second active layer arranged at an identical layer and on the first insulation layer; the first drain electrode in contact with and electrically connected to the second source electrode;
a second insulation layer arranged on and covering the first source electrode, the first drain electrode, the first active layer, the second source electrode, the second drain electrode, the second active layer, the lower source electrode, the lower drain electrode, and the lower active layer;
the gate electrode of the pixel switch and a gate insulating layer arranged on the second insulation layer, the gate insulating layer covering the gate electrode of the pixel switch;
the upper active layer, the upper source electrode, and the upper drain electrode arranged on the gate insulating layer, the second drain electrode and the lower source electrode are electrically connected to the upper source electrode through a via hole in the gate insulating layer and the second insulation layer; and
an upper insulation layer arranged on and covering the upper active layer, the upper source electrode and the upper drain electrode.

2. The pixel structure according to claim 1, wherein the upper active layer and the lower active layer are of different thicknesses or of different materials, so that an identical signal from the touch unit has different transmission time in the top-gate TFT and the bottom-gate TFT so as to form the first signal and the second signal, respectively.

3. The pixel structure according to claim 1, further comprising light shielding layers; wherein the shielding layers are formed at positions corresponding to the active layer of the top-gate TFT and the second active layer.

4. A display apparatus, comprising the pixel structure according to claim 1.

5. A method for driving a pixel structure, wherein
the pixel structure comprises a pixel switch comprising a gate electrode, an upper source electrode, an upper drain electrode, an upper active layer, a lower source electrode, a lower drain electrode, and a lower active layer; wherein the upper source electrode, the upper active layer, the upper drain electrode, and the gate electrode form a bottom-gate thin film transistor (TFT); the lower source electrode, the lower active layer, the lower drain electrode, and the gate electrode form a top-gate TFT; the upper source electrode and the lower source electrode are connected to each other: a touch unit, configured to obtain a touch position signal; wherein an output end of the touch unit is connected to the upper source electrode and the lower source electrode, respectively, and configured to transmit the touch position signal to the bottom-gate TFT and the top-gate TFT, respectively; wherein the touch unit includes a photosensitive touch structure that comprises a sensing TFT and a switching TFT; the sensing TFT comprises a first active layer, a first source electrode, a first drain electrode, and a first gate electrode; the switching TFT comprises a second active layer, a second source electrode, a second drain electrode, and a second gate electrode; a pixel electrode comprising a first sub-pixel electrode and a second sub-pixel electrode; wherein the first sub-pixel electrode is connected to the upper drain electrode and configured to receive a first signal transmitted from the top-gate TFT; and the second sub-pixel electrode is connected to the lower drain electrode and configured to receive a second signal transmitted from the bottom-gate TFT, the second signal different from the first signal, and a capacitor formed by a first electrode and the first drain electrode; wherein the first electrode of the capacitor, the first gate electrode, the second gate electrode, the lower source electrode, the lower drain electrode, and the lower active layer arranged at an identical layer and on a substrate, the first electrode of the capacitor is in contact with and electrically connected to the first gate electrode; a first insulation layer is arranged on and covering the first electrode of the capacitor, the first gate electrode, the second gate electrode and the substrate; the first source electrode, the first drain electrode, the first active layer, the second source electrode, the second drain electrode, and the second active layer are arranged at an identical layer and on the first insulation layer; the first drain electrode is in contact with and electrically connected to the second source electrode; a second insulation layer is arranged on and covering the first source electrode, the first drain electrode, the first active layer, the second source electrode, the second drain electrode, the second active layer, the lower source electrode, the lower drain electrode, and the lower active layer; the gate electrode of the pixel switch and a gate insulating layer arranged on the second insulation layer; and the gate insulating layer covering the gate electrode of the pixel switch; the upper active layer, the upper source electrode and the upper drain electrode arranged on the gate insulating layer the second drain electrode and the lower source electrode electrically connected with the upper source electrode through a via hole in the gate insulating layer and the second insulation layer; and an upper insulation layer is arranged on and covering the upper active layer, the upper source electrode and the upper drain electrode;

the method comprising:
obtaining a touch position signal;
transmitting the touch position signal to the pixel switch;
transmitting a first signal outputted by the top-gate TFT to the first sub-pixel electrode of the pixel electrode and transmitting a second signal outputted by the bottom-gate TFT to the second sub-pixel electrode of the pixel electrode at a speed different from that at which the first signal is transmitted.

6. The method according to claim 5, wherein obtaining a touch position signal comprises:
obtaining the touch position signal by using the touch unit.

7. The method according to claim 6, wherein obtaining the touch position signal by using the touch unit comprises:
sensing a change of external brightness by the sensing TFT, and generating a corresponding photocurrent;
storing the generated photocurrent by the capacitor as to obtain the touch position signal.

8. The method according to claim 7, wherein transmitting the touch position signal the a pixel switch comprises:
conducting the photocurrent stored in the capacitor to the switching TFT;
turning on the switching TFT; and
conducting the photocurrent stored in the capacitor to the source electrodes of the top-gate TFT and the bottom-gate TFT through the second drain electrode, respectively.

9. A method for manufacturing a pixel structure, comprising:
forming a substrate;
forming a first electrode of a capacitor, a first gate electrode, a second gate electrode, a lower source electrode, a lower drain electrode, and a lower active layer at an identical layer and on the substrate, the first electrode of the capacitor in contact with and electrically connected to the first gate electrode;
forming a first insulation layer that is arranged on and covering the first electrode of the capacitor, the first gate electrode, the second gate electrode, and the substrate;
forming a first source electrode, a first drain electrode, a first active layer, a second source electrode, a second drain electrode, and a second active layer at an identical layer and on the first insulation layer; the first drain electrode in contact with and electrically connected to the second source electrode;
forming a second insulation layer that is arranged on and covering the first source electrode, the first drain electrode, the first active layer, the second source electrode, the second drain electrode, the second active layer, the lower source electrode, the lower drain electrode, and the lower active layer;
forming a gate electrode and a gate insulating layer on the second insulation layer, the gate insulating layer covering the gate electrode;
forming an upper active layer, an upper source electrode, and an upper drain electrode on the gate insulating layer; the second drain electrode and the lower source electrode electrically connected to the upper source electrode through a via hole in the gate insulating layer and the second insulation layer; and
forming an upper insulation layer that is arranged on and covering the upper active layer, the upper source electrode, and the upper drain electrode.

10. The method according to claim 9, wherein the lower active layer and the upper active layer comprise different thicknesses.

11. The method according to claim 9, further comprising:
providing light shielding layers at positions corresponding to the upper active layer and the second active layer.

12. The method according to claim 10, further comprising:
providing light shielding layers at positions corresponding to the upper active layer and the second active layer.

* * * * *